United States Patent
Tamaki et al.

(10) Patent No.: US 11,910,713 B2
(45) Date of Patent: Feb. 20, 2024

(54) THERMOELECTRIC CONVERSION TECHNIQUE

(71) Applicant: Panasonic Intellectual Property Management Co., Ltd., Osaka (JP)

(72) Inventors: Hiromasa Tamaki, Osaka (JP); Yuriko Kaneko, Nara (JP); Hiroki Sato, Shiga (JP); Tsutomu Kanno, Kyoto (JP); HyunJeong Nam, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 79 days.

(21) Appl. No.: 17/512,623

(22) Filed: Oct. 27, 2021

(65) Prior Publication Data
US 2022/0052245 A1 Feb. 17, 2022

Related U.S. Application Data

(63) Continuation of application No. PCT/JP2020/027533, filed on Jul. 15, 2020.

(30) Foreign Application Priority Data

Sep. 9, 2019 (JP) ................. 2019-163900

(51) Int. Cl.
*H10N 10/855* (2023.01)
*C01B 33/06* (2006.01)
*H10N 10/17* (2023.01)

(52) U.S. Cl.
CPC .......... *H10N 10/855* (2023.02); *C01B 33/06* (2013.01); *H10N 10/17* (2023.02); *C01P 2002/60* (2013.01); *C01P 2002/72* (2013.01); *C01P 2002/77* (2013.01); *C01P 2006/32* (2013.01); *C01P 2006/40* (2013.01)

(58) Field of Classification Search
CPC ... H10N 10/855; C01B 33/06; C01P 2002/60; C01P 2002/72; C01P 2002/77; C01P 2006/32; C01P 2006/40
See application file for complete search history.

(56) References Cited

U.S. PATENT DOCUMENTS

2006/0090787 A1* 5/2006 Onvural ................. H10N 10/81
136/212

OTHER PUBLICATIONS

Bodak et al., "Li—Mg—Si (Lithium—Magnesium—Silicon)", [online], [retrieved on Mar. 7, 2023]. Retrieved from the Internet:<URL: https://materials.springer.com/lb/docs/sm_lbs_978-3-540-32594-9_27—Continued—(Year: 2006).*
https://materials.springer.com/googlecdn/assets/sm_lbs/327/sm_lbs_978-3-540-32594-9_27/sm_lbs_978-3-540-32594-9_27.pdf?trackRequired=true&originUrl=/lb/docs/sm_lbs_978-3-540-32594-9_27&componentId=Download%20Chapter (Year: 2006).*

(Continued)

*Primary Examiner* — Tae-Sik Kang
(74) *Attorney, Agent, or Firm* — Rimon, P.C.

(57) ABSTRACT

The present disclosure provides a thermoelectric conversion material having a composition represented by a chemical formula of $Li_{2-a+b}Mg_{1-b}Si$. In this thermoelectric conversion material, either requirement (i) in which $0 \leq a \leq 0.0001$ and $0.0001 \leq b \leq 0.25-a$ or requirement (ii) in which $0.0001 \leq a \leq 0.25$ and $0 \leq b \leq 0.25-a$ is satisfied. The thermoelectric conversion material has an $Li_8Al_3Si_5$ type crystalline structure.

11 Claims, 4 Drawing Sheets

(56) References Cited

OTHER PUBLICATIONS

Bailey et al., "Potential for superionic conductors in thermoelectric applications", Current Opinion in Green and Sustainable Chemistry 2017, 4:58-63 (Year: 2017).*

Wanarattikan et al., "Effect of Grain Size and Film Thickness on the Thermoelectric Properties of Flexible Sb2Te3 Thin Films", Advances in Materials Science and Engineering, vol. 2019, Article ID 6954918, 7 pages (Year: 2019).*

Wengert et al., "Ionic Diffusion in a Ternary Superionic Conductor: An Ab Initio Molecular Dynamics Study", Physical Review Letters, vol. 77 No 25, Dec. 16, 1996, 5083-5085. (Year: 1996).*

International Search Report of PCT application No. PCT/JP2020/027533 dated Oct. 20, 2020.

D. Kevorkov et al., "Phase Equilibria and Thermodynamics of the Mg—Si—Li System and Remodeling of the Mg—Si System", Journal of Phase Equilibria and Diffusion, vol. 25, No. 2 , 2004, pp. 140-151.

J. F. Herbst et al., "Structural, electronic, and hydriding properties of Li2MgSi", Journal of Alloys and Compounds 492 (2010), Dec. 30, 2009, pp. 65-68.

Kornelius Nielsch et al., "Thermoelectric Nanostructures: From Physical Model Systems towards Nanograined Composites", Advanced Energy Materials 1, 2011, pp. 713-731.

Jun Yan et al., "Material descriptors for predicting thermoelectric performance", Energy & Environmental Science, 8, Dec. 19, 2014.

Eric S. Toberer et al., "Phonon engineering through crystal chemistry", Journal of Materials Chemistry, 21, Sep. 2, 2011, pp. 15843-15852.

H. Julian Goldsmid, "Introduction to Thermoelectricity", "Chapter 3 Thermoelectric Properties of Metals and Semiconductors", Springer Series in Materials Science, 2010.

Heng Wang et al., "Chapter 1 Material Design Considerations Based on Thermoelectric Quality Factor", Thermoelectric Nanomaterials, Springer Series in Materials Science vol. 182, ch. 1, 2013, pp. 3-32.

Jianming Chen et al., "First-Principles Predictions of Thermoelectric Figure of Merit for Organic Materials: Deformation Potential Approximation", Journal of Chemical Theory and Computation, 8, Aug. 6, 2012, pp. 3338-3347.

* cited by examiner

THERMOELECTRIC CONVERSION TECHNIQUE

BACKGROUND

1. Technical Field

The present disclosure relates to a thermoelectric conversion material, a thermoelectric conversion element, a method for obtaining an electric power, and a method for transporting heat, each method using the thermoelectric conversion material.

2. Description of the Related Art

When a temperature difference is generated between two ends of a thermoelectric conversion material, an electromotive force proportional to the above temperature difference is generated. This phenomenon in which thermal energy is converted to electric energy has been known as the Seebeck effect. A thermoelectric power generation technique is a technique to convert thermal energy directly to electric energy using the Seebeck effect.

As has been well known in a technical field of thermoelectric conversion materials, the performance of a thermoelectric conversion material used for a thermoelectric conversion device is evaluated by a dimensionless figure of merit ZT obtained by multiplying a figure of merit Z by an absolute temperature T. ZT is represented by an expression of $ZT=S^2\sigma T/\kappa$ in which S, $\sigma$, and $\kappa$ represent the Seebeck coefficient, the electric conductivity, and the thermal conductivity, respectively, of a material. As ZT is increased, the thermoelectric conversion efficiency is increased.

A method for manufacturing an $Li_2MgSi$ crystalline material has been disclosed in Non-Patent Document 1 (Journal of Phase Equilibria and Diffusion, vol. 25, No. 2, 2004, p. 140-151, by D. Kevorkov, R. Schmid-Fetzer and F. Zhang) and Non-Patent Document 2 (Journal of Alloys and Compounds, 492, 2010, p. 65-68, by J. F. Herbst and M. S. Meyer).

SUMMARY

One non-limiting and exemplary embodiment provides a novel thermoelectric conversion material.

In one general aspect, the techniques disclosed here feature a thermoelectric conversion material having a composition represented by a chemical formula of $Li_{2-a+b}Mg_{1-b}Si$. In the thermoelectric conversion material, either requirement (i): $0 \leq a \leq 0.0001$ and $0.0001 \leq b \leq 0.25-a$ or requirement (ii): $0.0001 \leq a \leq 0.25$ and $0 \leq b \leq 0.25-a$ is satisfied. The thermoelectric conversion material has an $Li_8Al_3Si_5$ type crystalline structure.

The present disclosure provides a novel thermoelectric conversion material.

It should be noted that general or specific embodiments may be implemented as a system, a method; an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Hereinafter, embodiments of the present disclosure will be described with reference to the drawings.

A thermoelectric conversion material of the present disclosure has a composition represented by a chemical formula of $Li_{2-a+b}Mg_{1-b}Si$.

Either the following requirement (i) or (ii) is satisfied:
Requirement (i): $0 \leq a \leq 0.0001$ and $0.0001 \leq b \leq 0.25-a$
Requirement (ii): $0.0001 \leq a \leq 0.25$ and $0 \leq b \leq 0.25-a$.

The thermoelectric conversion material has an $Li_8Al_3Si_5$ type crystalline structure.

Figure 1:
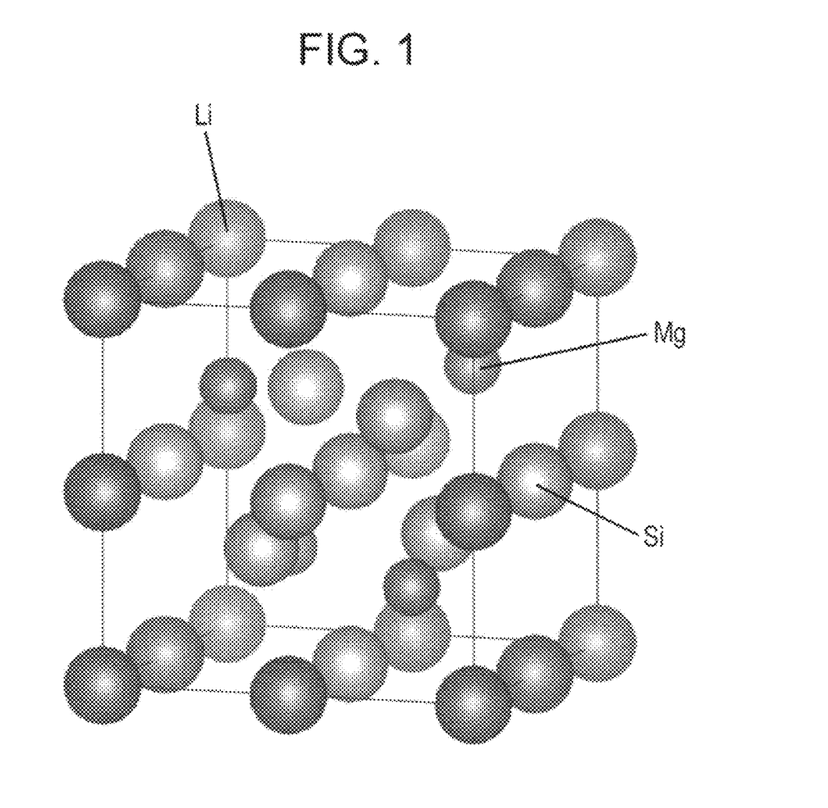
FIG. 1 is a schematic view showing a crystalline structure of $Li_2MgSi$.

As shown in FIG. 1, an $Li_2MgSi$ crystalline material has a crystalline structure also referred to as an $Li_8Al_3Si_5$ type which belongs to the space group P-43m. This type of crystalline structure has been disclosed in the Inorganic Crystalline Structure Database (ICSD). In addition, in Non-Patent Documents 1 and 2, the $Li_2MgSi$ crystalline material has not been treated as a thermoelectric conversion material, and hence, the figure of merit ZT thereof has not been disclosed.

By using a material search method based on data science, which is called material informatics, the present inventors calculated predictive values of figures of merit ZT of tens of thousands of compounds contained in the Inorganic Crystalline Structure Database. A prediction model for the figure of merit ZT, which was independently established by the present inventors, was used for the calculation. This prediction model has a higher accuracy than those of existing methods. Therefore, by using this prediction model, reliable prediction results can be obtained as compared to those obtained in the past. Accordingly, the present inventors studied whether or not an $Li_2MgSi$ crystalline material, which had not been treated as a thermoelectric conversion material, was a promising material as a thermoelectric conversion material.

An $Li_2MgSi$ crystalline material in a defect free state lacks carriers. Hence, a defect-free $Li_2MgSi$ crystalline material may not be expected to have a high figure of merit ZT. Accordingly, in order to improve the figure of merit ZT, the present inventors studied to introduce defects into an $Li_2MgSi$ crystalline material to generate p-type carriers. As a result, the present inventors finally come to two types of defects, that is, one defect to generate a hole at an Li site and the other defect at which Li occupies an Mg site. In addition, the present inventors also studied a decrease in thermal conductivity and an improvement in figure of merit ZT by providing crystalline grain boundaries in $Li_2MgSi$.

In addition, the figure of merit ZT of an $Li_{2-a+b}Mg_{1-b}Si$ crystalline material was calculated, and ranges of a and b for obtaining a high figure of merit ZT were found. Furthermore, an $Li_{1.8}MgSi$ crystalline material was actually synthesized. In particular, as shown in Examples 1 to 17 and Comparative Examples 1 to 3 which will be described below, when $0 \le a \le 0.0001$ and $0.0001 \le b \le 0.25-a$ are satisfied, or when $0.0001 \le a \le 0.25$ and $0 \le b \le 0.25-a$ are satisfied, the $Li_{2-a+b}Mg_{1-b}Si$ crystalline material can have a high figure of merit ZT of greater than or equal to 0.10 at 400K.

The thermoelectric conversion material of the present disclosure has an $Li_8Al_3Si_5$ type crystalline structure. The thermoelectric conversion material of the present disclosure has typically a p-type polarity.

The thermoelectric conversion material of the present disclosure may also have a polycrystalline structure. In addition, an average grain diameter of crystalline grains contained in the polycrystalline structure may be larger than or equal to 0.64 nm and smaller than or equal to 100 nm or may also be larger than or equal to 064 nm and smaller than or equal to 10 nm.

(Manufacturing Method)

As a method for forming an $Li_2Mgsi$ crystalline material using elements of Li, Mg, and Si as raw materials, for example, a method for performing floating melting by an induction heating method (see Non-Patent Document 1) or a method for performing mechanical pulverizing and mixing by a ball mill method (see Non-Patent Document 2) may be used. For a method for forming a bulky material by the above latter method, "Synthesis and thermoelectric characteristics evaluation of $Li_{2-a+b}Mg_{1-b}Si$" described in Examples may be referred to.

In addition, as a method for forming an $Li_2MgSi$ crystalline material having a grain boundary structure composed of fine crystalline grains, a method for sintering, by a hot-press method, powdered fine particles having a nano-level grain diameter obtained by mechanical alloying (see Non-Patent Document 3: Advanced Energy Materials 1, 2011, p. 713-731, by K. Nielsch et al.) may be used.

However, the manufacturing method is not limited to the examples described above.

An Li deficient amount and an Li substitution amount in an Mg site can be controlled, for example, by changing an Li amount of a starting material with respect to an Mg amount.

(Thermoelectric Conversion Element)

Figure 2:
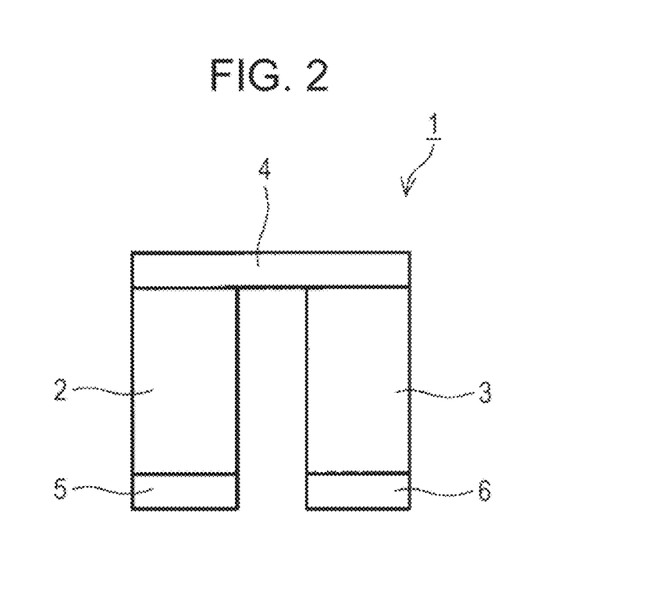
FIG. 2 is a schematic view showing one example of a thermoelectric conversion element of the present disclosure.

With the thermoelectric conversion material of the present disclosure, a thermoelectric conversion element can be formed. As shown in FIG. 2, one example of this thermoelectric conversion element comprises: a p-type thermoelectric conversion portion 2, an n-type thermoelectric conversion portion 3, a first electrode 4, a second electrode 5, and a third electrode 6. One end of the p-type thermoelectric conversion portion 2 and one end of the n-type thermoelectric conversion portion 3 are electrically connected to each other with the first electrode 4 interposed therebetween. The other end of the p-type thermoelectric conversion portion 2 is electrically connected to the second electrode 5. The other end of the n-type thermoelectric conversion portion 3 is electrically connected to the third electrode 6. The p-type thermoelectric conversion portion 2 contains the thermoelectric conversion material of the present disclosure. The n-type thermoelectric conversion portion 3 contains, as one example, an $Mg_3(Sb, Bi)_2$-based thermoelectric conversion material. In particular, for example, the $Mg_3(Sb, Bi)_2$-based thermoelectric conversion material has a composition represented by $Mg_{3.08}Sb_{1.49}Bi_{0.49}Se_{0.02}$.

In the thermoelectric conversion element described above, for example, when a temperature difference is formed such that the one end of the p-type thermoelectric conversion portion 2 and the one end of the n-type thermoelectric conversion portion 3 are set at a high temperature, and the other end of the p-type thermoelectric conversion portion 2 and the other end of the n-type thermoelectric conversion portion 3 are set at a low temperature, an electric power is obtained.

In addition, in the thermoelectric conversion element described above, when a current is applied thereto, heat is transported from the one end of the p-type thermoelectric conversion portion 2 and the one end of the n-type thermoelectric conversion portion 3 to the other end of the p-type thermoelectric conversion portion 2 and the other end of the n-type thermoelectric conversion portion 3. When the polarity of the current is reversed, a heat transport direction is also reversed, and heat is transported from the other end of the p-type thermoelectric conversion portion 2 and the other end of the n-type thermoelectric conversion portion 3 to the one end of the p-type thermoelectric conversion portion 2 and the one end of the n-type thermoelectric conversion portion 3.

Figure 3:
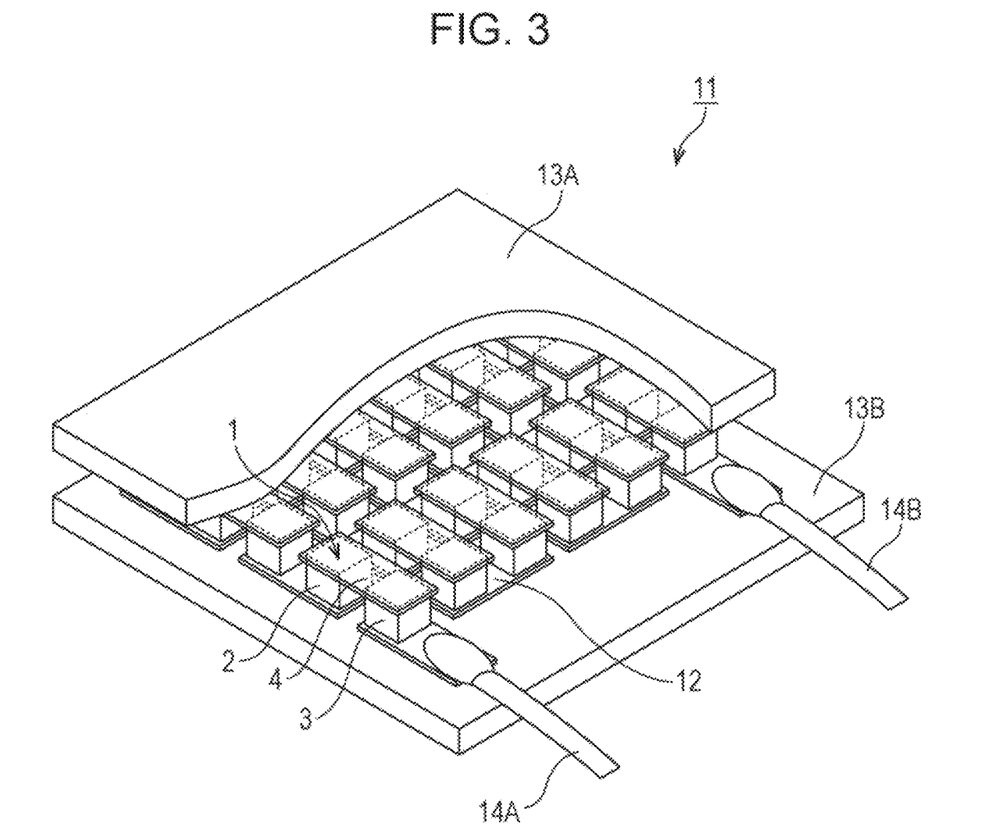
FIG. 3 is a schematic view showing one example of a thermoelectric conversion module comprising the thermoelectric conversion element of the present disclosure.

An thermoelectric conversion module is allowed to be formed, for example, with the above-described thermoelectric conversion element. As shown in FIG. 3, one example of a thermoelectric conversion module 11 comprises a plurality of thermoelectric conversion elements 1. In this example, the thermoelectric conversion elements 1 are disposed between a substrate 13A and a substrate 13B such that units each comprising the p-type thermoelectric conversion portion 2 and the n-type thermoelectric conversion portion 3 are repeatedly located. The units are electrically connected in series from an output line 14A to an output line 14B of the thermoelectric conversion module 11 with connection electrodes 12 interposed therebetween. In each unit, the connection electrode 12 functioning as the third electrode 6, the n-type thermoelectric conversion portion 3, the first electrode 4, the p-type thermoelectric conversion portion 2, and the connection electrode 12 functioning as the second electrode 5 are electrically connected to each other in the order described above.

(Method for Obtaining Electric Power Using Thermoelectric Conversion Material)

In this embodiment, for example, when electrodes are disposed at one end and the other end of the thermoelectric conversion material of the present disclosure, respectively, and a temperature difference is formed such that the one end and the other end thereof are set at a high temperature and a low temperature, respectively, p-type carriers are transferred from the one end to the other end, and as a result, an electric power is obtained.

(Method for Transporting Heat Using Thermoelectric Conversion Material)

In addition, in this embodiment, when a current is applied to the thermoelectric conversion material of the present disclosure, the Peltier effect is generated, and as a result, heat is transported from one end of the thermoelectric conversion material to the other end thereof. By the method described above, cooling and temperature control using the thermoelectric conversion material can be performed.

Examples

Hereinafter, with reference to Examples, the thermoelectric conversion material of the present disclosure will be described in more detail. However, the thermoelectric conversion material of the present disclosure is not limited to the following concrete modes.

(Analysis of Crystalline Structure)

Figure 4:
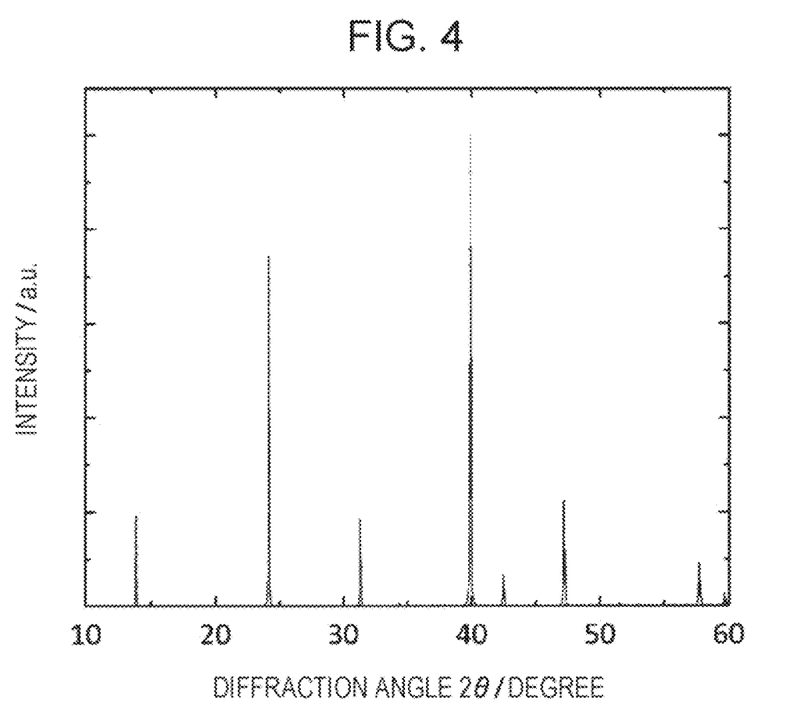
FIG. 4 is a graph showing a diffraction X-ray intensity distribution of an $Li_2MgSi$ crystalline structure.

Non-Patent Document 1 discloses that the crystalline structure of an $Li_2MgSi$ crystalline material belongs to the space group P-43m. Based on an X-ray crystal diffraction method, an X-ray diffraction peak of an $Li_8Al_3Si_5$ type crystalline structure can be confirmed. FIG. 4 is a graph showing a diffraction X-ray intensity distribution of an $Li_2MgSi$ crystalline structure obtained by calculation of a crystalline structure factor F and an integrated diffraction intensity I of $Li_2MgSi$ using software (RIETAN, available from URL:http://fujioizumi.verse.jp/download/download. html). The diffraction X-ray intensity distribution shown in the graph approximately corresponded to the diffraction X-ray intensity distribution of an $Li_8Al_3Si_5$ type crystalline structure. That is, it was confirmed that the $Li_2MgSi$ crystalline structure had an $Li_8Al_3Si_5$ type crystalline structure.

The crystalline structure factor F is obtained by the following relational expression (1).

$$F = \Sigma f_i \exp(2\pi i r_i \Delta k) \quad (1)$$

In the above expression, $r_i$ represents a position vector of an atom in the crystal, $f_i$ represents an atomic scattering factor of an atom located at a position $r_i$, and $\Delta k$ represents a difference in X-ray wave number vector before and after scattering.

The integrated diffraction intensity I is obtained by the following relational expression (2).

$$I = I_e L |F|^2 N^2 \quad (2)$$

In the above expression, $I_e$ represents a scattering intensity of one atom, N represents the number of unit lattices in the crystal, and L represents a coefficient including a suction factor and being dependent on experimental conditions.

(Method for Calculating Stable Composition Range)

Next, a stable composition range of $Li_{2-a+b}Mg_{1-b}Si$ was calculated. The stable composition range can be predicted by "energy relative to the convex hull" obtained by a density functional method (hereinafter, referred to as DFT method).

First, as for virtual crystalline structures in each of which defect sites have been generated in an $Li_2MgSi$ crystalline structure and competitive phases including any one of Li, Mg, and Si as a constituent element, the presence of which has been already known in an Li—Mg—Si ternary phase diagram, all energies thereof were calculated. All the energies described above were calculated by the DFT method after structural optimization was performed. Subsequently, points corresponding to data thus calculated were plotted on a composition ratio-energy space. From data groups thus plotted, a convex hull curve was drawn for a data group of binary systems, and a convex hull curve was drawn for a data group of ternary systems or more. The data points on the convex hull, that is, data points each having an energy of zero relative to the convex hull, were determined as compositions which were stably present.

Among the $Li_2MgSi$ crystalline structures, as for a crystalline structure of an $Li_2MgSi$ mother material, a crystalline structure in which Li has been deficient, a crystalline structure in which Li partially has occupied the Mg site, and known crystalline structures on an Li—Mg—Si ternary phase diagram, all energies thereof were calculated using the DFT method, and a stability evaluation by the convex hull curved surface was performed. According to the evaluation, in a range in which $0 \leq a$, $b \leq 0.25$, and $0 \leq a+b \leq 0.25$ were satisfied in the composition represented by a formula of $Li_{2-a+b}Mg_{1-b}Si$, the energy relative to the convex hull was zero. That is, in the range described above, the $Li_{2-a+b}Mg_{1-b}Si$ crystal was predicted to be stably synthesized.

(Method for Calculating Thermoelectric Conversion Figure of Merit)

The thermoelectric conversion efficiency is determined by the figure of merit ZT of a material. ZT is defined by the following relational expression (3).

$$ZT = S^2 \sigma T / \kappa_e + \kappa_{lat}) \quad (3)$$

In the above expression, S represents the Seebeck coefficient, $\sigma$ represents the electric conductivity, T represents the absolute temperature in an evaluation environment, $\kappa_e$ represents the electron thermal conductivity, and $\kappa_{lat}$ represents the lattice thermal conductivity. S, $\sigma$, and $\kappa_e$ were predicted using the VASP code and the parabolic band model (see Non-Patent Document 4: "Introduction to Thermoelectricity", Chapter 3, 2010, by H. J. Goldsmid) in combination. The calculation expressions of the physical quantities in the parabolic band model are as shown by the following expressions (4) to (7).

$$S(\eta) = k_B/e + [2F_1(\eta)/F_0(\eta) - \eta] \quad (4)$$

$$\sigma(\eta) = e(2k_B T)^{3/2}/3\pi^2(h/2\pi)^3 \times m_d^{3/2} \mu \times F_0(\eta) \quad (5)$$

$$\kappa_e = (2k_B)^{3/2} T^{1/2}/3 e \pi^2 (h/2\pi)^3 \times m_d^{3/2} \mu \times [F_2(\eta) - F_1^2(\eta)/F_0(\eta)]. \quad (6)$$

$$F_i(\eta) = \int_0^\infty x^i dx/(\exp[x-\eta]+1) \quad (7)$$

The physical quantities are determined when the density-of-states effective mass $m_d$, the mobility and the reduced Fermi energy, $_r$ ($=-E_F/K_B T$) are given. As described below, the reduced Fermi energy was calculated from the defect concentration. The density-of-states effective mass ma was obtained by fitting the density of states obtained by the VASP code to the following relational expression (8).

$$D_{VB}(E-E_F) = 4\pi(2m_d)^{3/2}/h^3 \times (E_F-E)^{1/2} \quad (8)$$

The mobility μ which is the parameter when $\sigma$ is determined was obtained by the following theoretical expression (9) (see Non-Patent Document 5: Thermoelectric Nanomaterials, ed. K. Koumoto and T. Mori, Springer, Berlin Heidelberg, vol. 182, ch. 1, 2013, p. 3-32, by H. Wang et al.).

$$\mu = (8\pi)^{1/2} (h/2\pi)^4 eB/3m^{*5/2}(k_B T)^{3/2} g^2 \quad (9)$$

In the above expression, e represents the elementary charge, m* represents the effective mass of carrier, B represents the elastic constant, and g represents the deformation potential. m*, B, and g were calculated by the DFT method using the VASP code. In addition, g was calculated by a relational expression of $g = -\Delta\varepsilon(\Delta I/I)$ disclosed in Non-Patent Document 6 ("First-Principles Predictions of Thermoelectric Figure of Merit for Organic Materials: Deformation Potential Approximation", Journal of Chemical Theory and Computation, 8, 2012, p. 3338-3347, by J. Chen et al.). $\Delta\varepsilon$ represents the change in amount of band edge energy level when the lattice constant I was changed by $\Delta I$.

The lattice thermal conductivity $\kappa_{lat}$ was calculated by the following empirical expression (10) based on the debye-Callaway model disclosed in Non-Patent Document 7 ("Material descriptors for predicting thermoelectric performance", Energy & Environmental Science, 8, 2015, p. 983-994, by J. Yang et al.).

$$\kappa_{lat} = \kappa_{acoustic} + \kappa_{optical} \quad (10)$$

$\kappa_{acoustic}$ and $\kappa_{optical}$ are represented by the following relational expressions (11) and (12).

$$\kappa_{acoustic} = A_1 M v^3 / V^{2/3} n^{1/3} \quad (11)$$

$$\kappa_{optical} = A_2 v / V^{2/3} (1 - 1/n^{2/3}) \quad (12)$$

In the expressions described above, M represents the average atomic mass, v represents the longitudinal acoustic wave velocity, and V represents the volume per one atom, and n represents the number of atoms contained in a unit cell. As $A_1$ and $A_2$, the values disclosed in Non-Patent Document 7 were used.

The calculation prediction of the figure of merit ZT comprises two steps, that is, a step of calculating the Fermi energy from the composition, in more particular, from the defect concentration and a step of calculating each physical quantity corresponding to the thus-calculated Fermi energy.

The reduced Fermi energy and the defect concentration are connected to each other by the following relational expressions (13) and (15).

$$p(E_F) = N_{q1}(E_F) + N_{q2}(E_F) \quad (13)$$

$$p(E_F) = 1 - \int D_{VB}(E)[1 - f(E;E_F)]dE \quad (14)$$

$$N_{q1,q2}(E_F) = N_{D1,D2} \sum_q q \exp[-E_{form,D1,D2}(q,E_F)/k_B T] / \sum_q \exp[-E_{form}(q,E_F)/k_B T] \quad (15)$$

In the above expressions, p represents the carrier concentration of the valence band, $N_{D1,D2}$ represent defect concentrations of defect species D1 (Li site deficiency) and D2 (Li substitution in Mg site), and $N_{q1,q2}$ ($E_F$) each represent the concentration of charge supplied to the valence band by the defects. In addition, DdVB (E) represents the density-of-states function of the valence band.

$E_{form}$(q, $E_F$) is the formation energy of a defect having a charge q and is represented by the following expression (16).

$$E_{form}(q,E_F) = E_{defect}(q) - E_{defect}(0) + q(E_{VBM} + E_F) \quad (16)$$

In the expression described above, $E_{defect}$ (q) represents the total energy of a crystal having a q-charged defect, and $E_{VBM}$ represents the energy at the upper end of the valence band. Those energy positions were evaluated using a calculation method based on the DFT method in the generalized gradient approximation range.

When the above relational expressions are simultaneously solved, the carrier concentration p and the Fermi energy with respect to each of specific defect concentrations $N_{D1}$ and $N_{D2}$ were calculated.

(Evaluation Result of Thermoelectric Conversion Characteristics)

In a composition range in which the $Li_{2-a+b}Mg_{1-b}Si$ crystal was predicted to be stably synthesized, the thermoelectric conversion characteristics including the figure of merit ZT was evaluated by the method described above. Tables 1, 2, and 3 show evaluation results of the thermoelectric conversion characteristics at 400K of a material having a composition represented by a formula of $Li_{2-a}$MgSi, a material having a composition represented by a formula of $Li_{2+b}Mg_{1-b}Si$, and a material having a composition represented by a formula of $Li_{2-a+b}Mg_{1-b}Si$, respectively.

TABLE 1

| [$Li_{2-a}$MgSi] | | | | |
|---|---|---|---|---|
| | a | S (µV/K) | σ (S/cm) | κ (W/mK) | ZT |
| COMPARATIVE EXAMPLE 1 | 0.00001 | 704 | 4.7 | 4.8 | 0.02 |
| EXAMPLE 1 | 0.0001 | 506 | 47 | 4.8 | 0.10 |
| EXAMPLE 2 | 0.001 | 312 | 441 | 5.1 | 0.34 |
| EXAMPLE 3 | 0.01 | 156 | 2775 | 6.7 | 0.40 |
| EXAMPLE 4 | 0.10 | 85 | 6894 | 10.3 | 0.20 |
| EXAMPLE 5 | 0.20 | 74 | 8129 | 11.5 | 0.16 |
| EXAMPLE 6 | 0.25 | 74 | 8524 | 11.9 | 0.15 |

As shown in Table 1, in the composition range of $Li_{2-a}$MgSi (0.0001≤a≤0.25), p-type characteristics in which S had a positive value were obtained, and in addition, a significantly higher ZT than that of Comparative Example 1 was evaluated.

TABLE 2

| [$Li_{2+b}Mg_{1-b}Si$] | | | | |
|---|---|---|---|---|
| | b | S (µV/K) | σ (S/cm) | κ (W/mK) | ZT |
| COMPARATIVE EXAMPLE 2 | 0.00001 | 704 | 4.7 | 4.8 | 0.02 |
| EXAMPLE 7 | 0.0001 | 506 | 47 | 4.8 | 0.10 |
| EXAMPLE 8 | 0.001 | 315 | 429 | 5.1 | 0.34 |
| EXAMPLE 9 | 0.01 | 166 | 2443 | 6.5 | 0.42 |
| EXAMPLE 10 | 0.10 | 95 | 6016 | 9.5 | 0.23 |
| EXAMPLE 11 | 0.20 | 83 | 7165 | 10.5 | 0.19 |
| EXAMPLE 12 | 0.25 | 79 | 7539 | 10.9 | 0.17 |

As shown in Table 2, in the composition range of $Li_{2+b}Mg_{1-b}Si$ (0.0001≤b≤0.25), p-type characteristics in which S had a positive value were obtained, and in addition, a significantly higher ZT than that of Comparative Example 2 was evaluated.

TABLE 3

| [$Li_{2-a+b}Mg_{1-b}Si$] | | | | | |
|---|---|---|---|---|---|
| | a | b | S (µV/K) | σ (S/cm) | κ (W/mK) | ZT |
| COMPARATIVE EXAMPLE 3 | 0.00001 | 0.00001 | 644 | 9.4 | 4.8 | 0.03 |
| EXAMPLE 13 | 0.0001 | 0.0001 | 447 | 93 | 4.9 | 0.15 |
| EXAMPLE 14 | 0.001 | 0.001 | 260 | 807 | 5.3 | 0.41 |
| EXAMPLE 15 | 0.01 | 0.01 | 131 | 3714 | 7.5 | 0.35 |
| EXAMPLE 16 | 0.10 | 0.10 | 78 | 7700 | 11.1 | 0.17 |
| EXAMPLE 17 | 0.125 | 0.125 | 75 | 8089 | 11.4 | 0.16 |

As shown in Table 3, in the composition range of $Li_{2-a+b}Mg_{1-b}Si$ (0.0001≤a, b≤0.125), p-type characteristics in which S had a positive value were obtained, and in addition, a significantly higher ZT than that of Comparative Example 3 was evaluated.

(Evaluation of Thermoelectric Conversion Characteristics of Polycrystalline Thermoelectric Conversion Material Having Crystalline Grain Boundaries)

Figure 5:
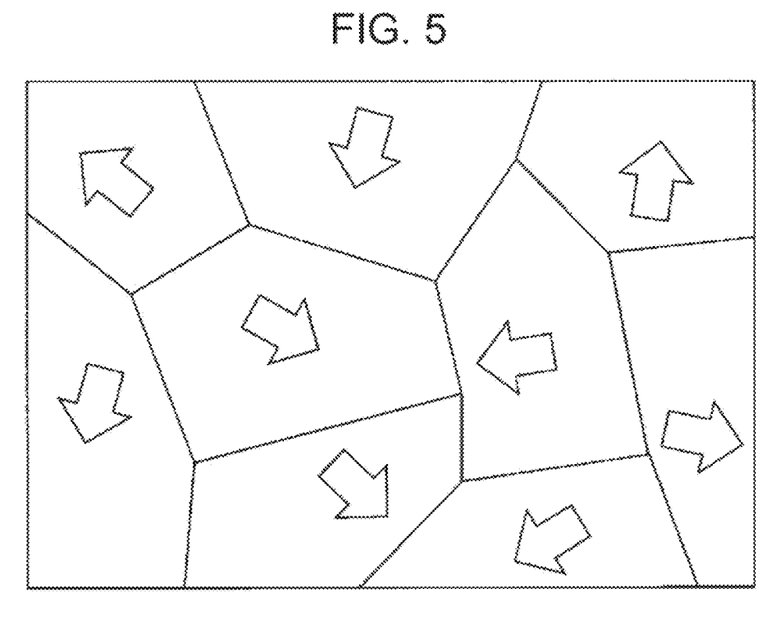
FIG. 5 is a schematic view showing one example of a cross-sectional texture of a thermoelectric conversion material having a grain boundary structure.

The figure of merit ZT of a polycrystalline thermoelectric conversion material having crystalline grain boundaries can be calculated by expansion of the theoretical expression of the lattice thermal conductivity according to the theory described above. In a thermoelectric conversion material having a grain boundary structure composed of fine crystalline grains, it has been known that since the lattice thermal conductivity is suppressed, ZT can be improved. As shown in FIG. 5, in a cross-section texture having the above grain boundary structure, in general, the directions of the crystalline grains are randomly distributed.

The lattice thermal conductivity of a material having a grain boundary structure with an average grain diameter d can be evaluated by the following expressions (17) and (18) in which the theoretical expression disclosed in Non-Patent Document 7 and the theoretical expression disclosed in Non-Patent Document 8 (Journal of Materials Chemistry, 21, 2011, p. 15843-15852, by E. S. Toberer, A. Zevalkink and G. J. Snyder) are used in combination.

$$\kappa_{lat}=1/(1/\kappa_{acoustic}+1/\kappa_{grain})+\kappa_{optical} \quad (17)$$

$$\kappa_{grain}=k_B B d/2nV \quad (18)$$

In the expressions described above, $\kappa_{acoustic}$ represents the acoustic phonon thermal conductivity when the average grain diameter is infinite, $\kappa_{grain}$ represents the correction value of the acoustic phonon thermal conductivity when grain boundary scattering occurs, and $\kappa_{optical}$ represents the thermal conductivity of optical phonons. In addition, at in the limit in which d approaches ∞ calculated by the expression (17), that is, in the limit in which the uniform single crystal is formed without crystalline grain boundaries, matches with $\kappa_{lat}$ calculated by the above expression (10). Hence, the expression (10) is included in the expression (17).

The average grain diameter of this specification may be defined as described below. From an observed image of a cross-section of a thermoelectric conversion material with a scanning electron microscope (hereinafter, referred to as SEM), the number N of crystalline grains is counted. In this case, crystalline grains partially observed at edge portions of the observed image are each counted as 0.5 for the convenience. The average grain diameter (namely, average crystalline grain diameter, hereinafter, also referred to as "AGS" in some cases) is defined by the following expression (II) using the number N of the crystalline grains, the area A of the viewing field of the observed image, and the circular constant π.

$$AGS=\{4A/(\pi N)\}^{1/2} \quad (II)$$

The expression (II) is an approximate expression representing the average grain diameter of crystalline grains on the assumption in that the crystalline grains are each a true sphere, and a cross-section passing through the center of the crystalline grain is observed. In actual, the crystalline grains have irregular shapes and are not true spheres. Hence, the average grain diameter calculated from the expression (II) is not always equal to the true average grain diameter of the crystalline grains. However, in this specification, the value represented by the expression (II) is regarded as the average grain diameter for the convenience, and by this value, the description of Examples and Claims are defined.

Based on the assumption in that the minimum value of a feasible average grain diameter d is a lattice constant of 0.64 nm, the relationship between d and the thermoelectric conversion characteristics was evaluated in the range of d≥0.64 nm with the above theoretical expressions. As for $Li_{2.01}Mg_{0.99}Si$ having the highest predictive value ZT obtained in the limit in which d approaches ∞, the relationship described above at 400K is shown in the following Table 4.

TABLE 4

| | d (nm) | S (μV/K) | σ (S/cm) | κ (W/mK) | ZT |
|---|---|---|---|---|---|
| EXAMPLE 18 | 10,000 | 166 | 2443 | 6.4 | 0.42 |
| EXAMPLE 19 | 1,000 | 166 | 2443 | 6.3 | 0.43 |
| EXAMPLE 20 | 100 | 166 | 2443 | 5.6 | 0.49 |
| EXAMPLE 21 | 10 | 166 | 2443 | 3.6 | 0.78 |
| EXAMPLE 22 | 1 | 166 | 2443 | 2.7 | 1.00 |
| EXAMPLE 23 | 0.64 | 166 | 2443 | 2.7 | 1.01 |

As shown in Table 4, in all Examples, p-type characteristics in which S had a positive value were obtained, and a significantly higher ZT than that of Comparative Example 2 was obtained. In addition, when the average grain diameter d was smaller than or equal to 100 nm, and in particular, when the average grain diameter d was smaller than or equal to 10 nm, a specifically high ZT was evaluated.

(Synthesis and Thermoelectric Characteristics Evaluation of $Li_{2-a-b}Mg_{1-b}Si$)

Synthesis of the thermoelectric conversion material of the present disclosure having a composition of $Li_{2-a-b}Mg_{1-b}Si$ (a=0.2, b=0) and evaluation of the figure of merit ZT thereof were carried out as described below.

As raw materials, single elements of Li, Mg, and Si were weighed at a composition rate of 1.8:1:1. The thus-weighed raw materials were sealed in a stainless steel-made container filled with an argon atmosphere together with stainless steel-made balls each having a diameter of 10 mm. The thus-sealed raw materials were pulverized and mixed by a planetary ball mill method at a revolution rate of 400 rpm for 6 hours. The thus-obtained powder mixture was charged into a graphite-made mold and was then hot-pressed in an argon atmosphere. In the hot press, while a pressure at 90 MPa was applied, a temperature of 686° C. was maintained for 30 minutes. As described above, a cylindrical dense body having a 95% mass density with respect to the theoretical density was obtained.

Figure 6:
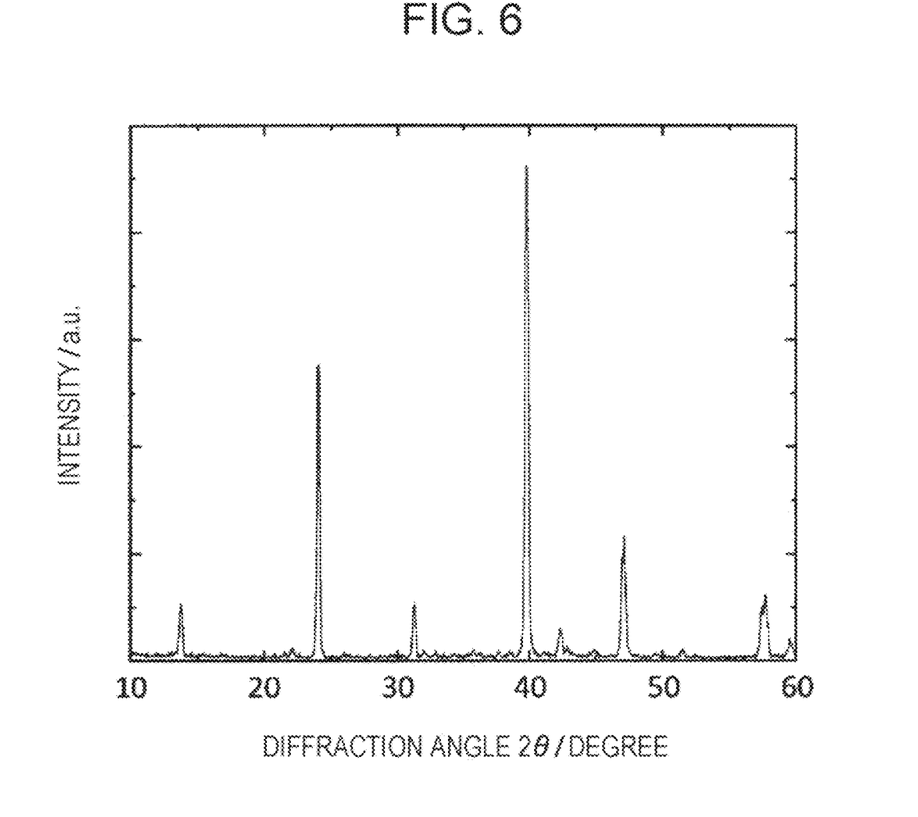
FIG. 6 is a graph showing a diffraction X-ray intensity distribution of an $Li_{1.8}MgSi$ thermoelectric conversion material formed in one example.

The crystalline structure of the thus-obtained dense body was identified as a single phase $Li_8Al_3Si_5$ type crystalline structure by an X-ray crystal diffraction method (see FIG. 6).

The chemical composition of the thus-obtained dense body was analyzed by an energy dispersive X-ray spectroscopic method. This analysis revealed that the dense body had a composition of $Li_{1.8}MgSi$. For the analysis, XFlash6|10 manufactured by Bruker was used.

The thus-obtained dense body was formed into strips and pellets by cutting, so that test pieces were obtained. A test piece having a strip shape was used to evaluate the Seebeck coefficient S and the electric conductivity σ. A test piece having a pellet shape was used to evaluate the thermal conductivity κ. For the evaluation of the Seebeck coefficient and the electric conductivity, ZEM-3 manufactured by Advance Riko, Inc. was used. For the evaluation of the thermal conductivity, LFA457 manufactured by NETZSCH was used.

The details of the evaluation method of the Seebeck coefficient are disclosed in U.S. patent application Ser. No. 14/847,321 (International Application No, PCT/JP2014/001882), U.S. patent application Ser. No. 14/847,362 (International Application No, PCT/JP2014/001883), and U.S. patent application Ser. No. 14/718,491 (International Application No. PCT/JP2014/001885).

The evaluation results of the thermoelectric conversion characteristics of thus-formed $Li_{1.8}MgSi$ at a temperature T are shown in the following Tables 5.

TABLE 5

| TEMPERATURE T (K) | S (μV/K) | σ (S/cm) | κ (W/mK) | ZT |
|---|---|---|---|---|
| 329 | 60 | 4116 | 6.3 | 008 |
| 376 | 65 | 3699 | 5.9 | 010 |
| 425 | 73 | 3199 | 5.1 | 014 |

As described above, it was confirmed that the single phase synthesis of $Li_{2-a+b}Mg_{1-b}Si$ could be performed, and that, in addition, the thermoelectric conversion characteristics equivalent to those predicted by the calculation were also achieved.

The thermoelectric conversion material of the present disclosure is usable for a thermoelectric conversion element and a thermoelectric conversion module, each of which converts thermal energy into electric energy.

What is claimed is:

1. A thermoelectric conversion material having a composition represented by a chemical formula of $Li_{2-a+b}Mg_{1-b}Si$,
   wherein either the following requirements (i) or (ii) is satisfied:
   Requirement (i): $0 \leq a \leq 0.0001$ and $0.0001 \leq b \leq 0.25-a$, and
   Requirement (ii): $0.0001 \leq a \leq 0.125$ and $0 \leq b \leq 0.25-a$.

2. The thermoelectric conversion material according to claim 1,
   wherein the thermoelectric conversion material has a p-type polarity.

3. The thermoelectric conversion material according to claim 1,
   wherein the thermoelectric conversion material has a polycrystalline structure, and
   the polycrystalline structure includes crystalline grains having an average grain diameter of larger than or equal to 0.64 nm and smaller than or equal to 100 nm.

4. The thermoelectric conversion material according to claim 3,
   wherein the average grain diameter is larger than or equal to 0.64 nm and smaller than or equal to 10 nm.

5. A p-type thermoelectric conversion element comprising:
   a thermoelectric conversion portion,
   wherein the thermoelectric conversion portion comprises the thermoelectric conversion material according to claim 1.

6. A thermoelectric conversion element comprising:
   a p-type thermoelectric conversion portion;
   an n-type thermoelectric conversion portion;
   a first electrode;
   a second electrode; and
   a third electrode,
   wherein:
   one end of the p-type thermoelectric conversion portion and one end of the n-type thermoelectric conversion portion are electrically connected to each other with the first electrode interposed therebetween,
   the other end of the p-type thermoelectric conversion portion is electrically connected to the second electrode,
   the other end of the n-type thermoelectric conversion portion is electrically connected to the third electrode, and
   the p-type thermoelectric conversion portion contains the thermoelectric conversion material according to claim 1.

7. A method for obtaining an electric power using a thermoelectric conversion material, the method comprising:
   applying a temperature difference to the thermoelectric conversion material,
   wherein the thermoelectric conversion material is the thermoelectric conversion material according to claim 1.

8. A method for transporting heat using a thermoelectric conversion material, the method comprising:
   applying a current to the thermoelectric conversion material,
   wherein the thermoelectric conversion material is the thermoelectric conversion material according to claim 1.

9. The thermoelectric conversion material according to claim 1, wherein the thermoelectric conversion material has a crystalline structure same as an $Li_8Al_3Si_5$ crystalline structure.

10. The thermoelectric conversion material according to claim 1, wherein a crystalline structure of the thermoelectric conversion material belongs to a space group of P-43m.

11. The thermoelectric conversion material according to claim 1,
    wherein when $0.0001 \leq a \leq 0.125$ and $0.0001 \leq b \leq 0.125$, a conductivity of the thermoelectric conversion material is in the range of 93 S/cm to 8089 S/cm.

* * * * *